United States Patent
Munson et al.

(10) Patent No.: US 7,626,391 B2
(45) Date of Patent: Dec. 1, 2009

(54) HIGH-THROUGHPUT SYSTEMS FOR MAGIC-ANGLE SPINNING NUCLEAR MAGNETIC RESONANCE

(75) Inventors: Eric J. Munson, Lawrence, KS (US);
Dewey H. Barich, Lawrence, KS (US);
Benjamin N. Nelson, Lawrence, KS (US)

(73) Assignee: University of Kansas, Lawrence, KS (US)

( * ) Notice: Subject to any disclaimer, the term of this patent is extended or adjusted under 35 U.S.C. 154(b) by 0 days.

(21) Appl. No.: 12/013,237

(22) Filed: Jan. 11, 2008

(65) Prior Publication Data
US 2008/0169814 A1    Jul. 17, 2008

Related U.S. Application Data

(60) Provisional application No. 60/879,885, filed on Jan. 11, 2007.

(51) Int. Cl.
*G01V 3/00* (2006.01)
(52) U.S. Cl. ........................ 324/318; 324/321
(58) Field of Classification Search ............... 324/318, 324/321, 322
See application file for complete search history.

(56) References Cited

U.S. PATENT DOCUMENTS

| | | | |
|---|---|---|---|
| 4,654,592 A * | 3/1987 | Zens | 324/307 |
| 6,696,838 B2 * | 2/2004 | Raftery et al. | 324/321 |
| 6,794,874 B2 | 9/2004 | Hasegawa | |
| 6,937,020 B2 | 8/2005 | Munson et al. | |
| 7,282,919 B2 * | 10/2007 | Doty et al. | 324/321 |
| 2002/0130661 A1 | 9/2002 | Raftery et al. | |
| 2004/0222796 A1 | 11/2004 | Munson et al. | |
| 2006/0192559 A1 | 8/2006 | Ardenkjaer-Larsen et al. | |

OTHER PUBLICATIONS

Oldfield, *A Multiple-Probe Strategy for Ultra-High-Field Nuclear Magnetic Resonance Spectroscopy*, J. Magnetic Resonance 107 255-257 (1994).

* cited by examiner

*Primary Examiner*—Louis M Arana
(74) *Attorney, Agent, or Firm*—Stinson Morrison Hecker LLP

(57) ABSTRACT

A solid-state nuclear magnetic resonance probe for use in a magnetic field having a plurality of isolated magic angle spinning modules positioned within the housing is disclosed. The housing is configured so that the plurality of magic angle spinning modules are located in a stationary position within a homogenous region of said magnetic field during use.

20 Claims, 3 Drawing Sheets

HIGH-THROUGHPUT SYSTEMS FOR MAGIC-ANGLE SPINNING NUCLEAR MAGNETIC RESONANCE

CROSS-REFERENCE TO RELATED APPLICATIONS

This application is based on and claims priority to U.S. Provisional Application Ser. No. 60/879,885, filed on Jan. 11, 2007, which is hereby incorporated by reference in its entirety.

STATEMENT REGARDING FEDERALLY SPONSORED RESEARCH OR DEVELOPMENT

Not applicable.

BACKGROUND OF THE INVENTION

1. Field of the Invention

This invention relates to a magic angle spinning ("MAS") nuclear magnetic resonance ("NMR") probe for the analysis of solids and semi-solids. In addition, the invention relates to a probe having two or more MAS systems within the homogeneous region of the magnetic field.

2. Description of Related Art

Solid-state NMR spectroscopy is a powerful technique for the analysis of solids and semi-solids. It is a non-destructive and non-invasive technique that can provide selective, quantitative, and structural information about the sample being analyzed.

Maximizing the utility and increasing sensitivity and sample throughput for the analysis of materials using solid-state NMR spectroscopy is of interest because for most solid samples less than one percent of the time in the magnetic field is spent on data acquisition. The rest of the time (greater than 99%) is spent waiting for the spin populations to return to their equilibrium value via spin-lattice relaxation ($T_1$). However, the spin-spin relaxation time, $T_2$, is usually several orders of magnitude shorter than $T_1$. This means that the preparation and acquisition time in a Fourier Transform solid-state NMR experiment is typically tens of milliseconds. Before the sample can be pulsed again, the sample must relax for several seconds to several hours as the bulk magnetization returns to its equilibrium value. During this time, the sample must remain in a large static magnetic field, but is not required to be in a homogeneous magnetic field.

One example of compounds that have long $T_1$ times is pharmaceutical compounds. New drug compounds often are poorly crystalline or even amorphous, have long relaxation times, and are present at low levels in a formulation. This creates a significant problem for analyzing these compounds using solid-state NMR spectroscopy, because analysis times can range from a few minutes to a few days depending upon the state of the sample (i.e., bulk drug or formulated product), relative sensitivity (i.e., choice and number of different nuclei in molecule), and relaxation parameters. For example, aspirin is a representative pharmaceutical solid, and has a $T_1$ relaxation time of approximately 30 seconds at 300 MHz such that the pulse delay between acquisitions must be at least 90 seconds to avoid saturation. With salicylic acid, the delay between acquisitions exceeds one hour. Thus, to quantify a mixture of two forms of a compound can take a few hours (for a sample with short relaxation times) to a few days. To analyze a series of formulated products may take a month or more of spectrometer time. This leads to low throughput, high cost per sample analysis, and has relegated solid-state NMR spectroscopy in many cases to be a prohibitively expensive problem-solving technique compared to other analytical techniques such as powder X-ray diffraction, infrared and Raman spectroscopy, and Differential Scanning Calorimetry ("DSC").

Also, throughput has been a significant problem in NMR spectroscopy, because the design of the NMR magnet generally allows the analysis of only one sample at a time. Autosamplers have increased throughput by minimizing the time spent changing samples and by allowing continuous use of the spectrometer, but have not increased the number of samples that could be run if samples were changed promptly.

Some researchers have used strategies for the acquisition of multiple signals from multiple probes that are packed within the homogeneous portion of the magnet to maximize the utilization of an expensive analytical tool.

Oldfield, et al., *A Multiple-Probe Strategy for Ultra-High-Field Nuclear Magnetic Resonance Spectroscopy*, J. Mag. Res., Series A 107, 255-257 (1994), recognized more than a decade ago that throughput was a significant issue on high-field NMR spectrometers. He designed a "three-probe" system which contained three different samples simultaneously located in the homogeneous part of the magnet. Oldfield also proposed that one could incorporate sample spinning in one of the probes. The resolution of this system was reported as about 1 ppm. Typically, a resolution of 0.1 ppm is desirable for analysis of typical crystalline organic solids such as pharmaceuticals. This concept was extended to solution NMR spectroscopy by Raftery and coworkers in U.S. Pat. No. 6,696,838. Raftery showed that up to four different non-spinning samples could be located simultaneously in the homogeneous part of the magnetic field. The more non-spinning samples, however, the smaller the sample volume must be for all samples to be located simultaneously in the homogeneous region of the magnetic field.

The present inventors recently attempted to increase sensitivity by utilizing the fact that solid-state NMR spectroscopy, the sample must remain in a large static magnetic field, but is not required to be in a homogeneous magnetic field. Thus, multiple MAS systems were shuttled through the bore of the magnet as described in Munson et al., U.S. Pat. No. 6,937,020, which is incorporated by reference. Despite this significant advance in the art, two concerns arose with this probe design arising from (1) the mechanical movement of the probe by a distance between 3 to 20 cm; and (2) the eddy currents generated in the aluminum body of the probe after movement. The mechanical movement of a conventional probe can take up to one second or longer. The down side of this approach is that to cycle through seven modules would take at least seven seconds, and probably longer. Many samples have shorter relaxation times than that, and therefore it would be advantageous to have a design with a shorter switching time. Second, the movement of the probe in the magnetic field creates eddy currents, which manifest themselves in a change in resonance frequency of the NMR sample. This problem can probably be overcome by modifying the probe to minimize the metallic moveable parts.

BRIEF SUMMARY OF THE INVENTION

The present invention is directed to a novel solid-state nuclear magnetic resonance probe for use in a magnetic field comprising: a housing adapted to be placed in the magnetic field; and a plurality of isolated magic angle spinning modules positioned within the housing, the isolated spinning modules being configured to hold different samples for solid-state NMR analysis. The housing is configured so that the plurality of magic angle spinning modules are located within a homogeneous region of the magnetic field. The modules may be placed as close together as possible, typically less than 3 cm apart as measured from the center of one coil to the center of the other coil in the MAS modules.

In one aspect, the probe further comprising a radio-frequency isolation shield configured to reduce cross talk between said magic angle spinning modules.

In another aspect, the samples may be the same or different material for analysis. In another aspect, the invention is directed to a solid-state nuclear magnetic resonance spectrometer comprising: a magnet, the magnet defining a bore; a probe having at least two magic angle spinning modules; and an acquisition device coupled to the magic angle spinning modules, the acquisition device being configured to acquire a signal from said isolated spinning modules. The probe is configured so that at least two magic angle spinning modules are located within a homogeneous region of the magnetic field.

In another aspect, the present invention is directed to a method for the analysis of a solid-state sample comprising the steps of: providing a magnet for generating a magnetic field, the magnet defining a bore; providing a probe having a first isolated magic angle spinning module and a second isolated magic angle spinning module; positioning the probe within the bore of the magnet so that the first and second magic angle spinning modules are within a homogeneous region of said magnetic field; acquiring a first spectrum from a first sample contained within the first magic angle spinning module; and acquiring a second spectrum from a second sample contained within the second magic angle spinning module. The step of acquiring the first spectrum and the step of acquiring the second spectrum may be performed simultaneously or sequentially.

Additional aspects of the invention, together with the advantages and novel features appurtenant thereto, will be set forth in part in the description which follows, and in part will become apparent to those skilled in the art upon examination of the following, or may be learned from the practice of the invention. The objects and advantages of the invention may be realized and attained by means of the instrumentalities and combinations particularly pointed out in the appended claims.

DETAILED DESCRIPTION OF PREFERRED EMBODIMENT

The present invention relates to solid-state NMR spectroscopy. In particular, the present invention is directed to the use of a probe that increases sensitivity and throughput of samples being analyzed with solid-state NMR. A magic-angle spinning ("MAS") NMR probe is described to increase sensitivity and throughput, the probe including multiple spinning systems within the homogeneous region of a static magnetic field of a superconducting magnet.

As the terms are used in this application, "solid-state" and "sample" refer to any material, compound, or sample that is a solid or semi-solid. As the term is used in this application, "different samples" means samples contained within different MAS modules. The material being analyzed that is contained within the "different samples" may be the same or different.

As the term is used in this application, "plurality" means more than one. As the term is used in this application, "coupled" means a direct or indirect connection between two or more elements.

As used herein the term "homogeneous region" of the magnetic field refers to the region in the magnetic field in which, under MAS conditions, the line width as defined by full width at half height of a sample (such as adamantane) is below a threshold value of about 0.5 ppm, and preferably below about 0.3 ppm, and most preferably below about 0.1 ppm.

Two MAS-Module Probe Construction

Figure 1:
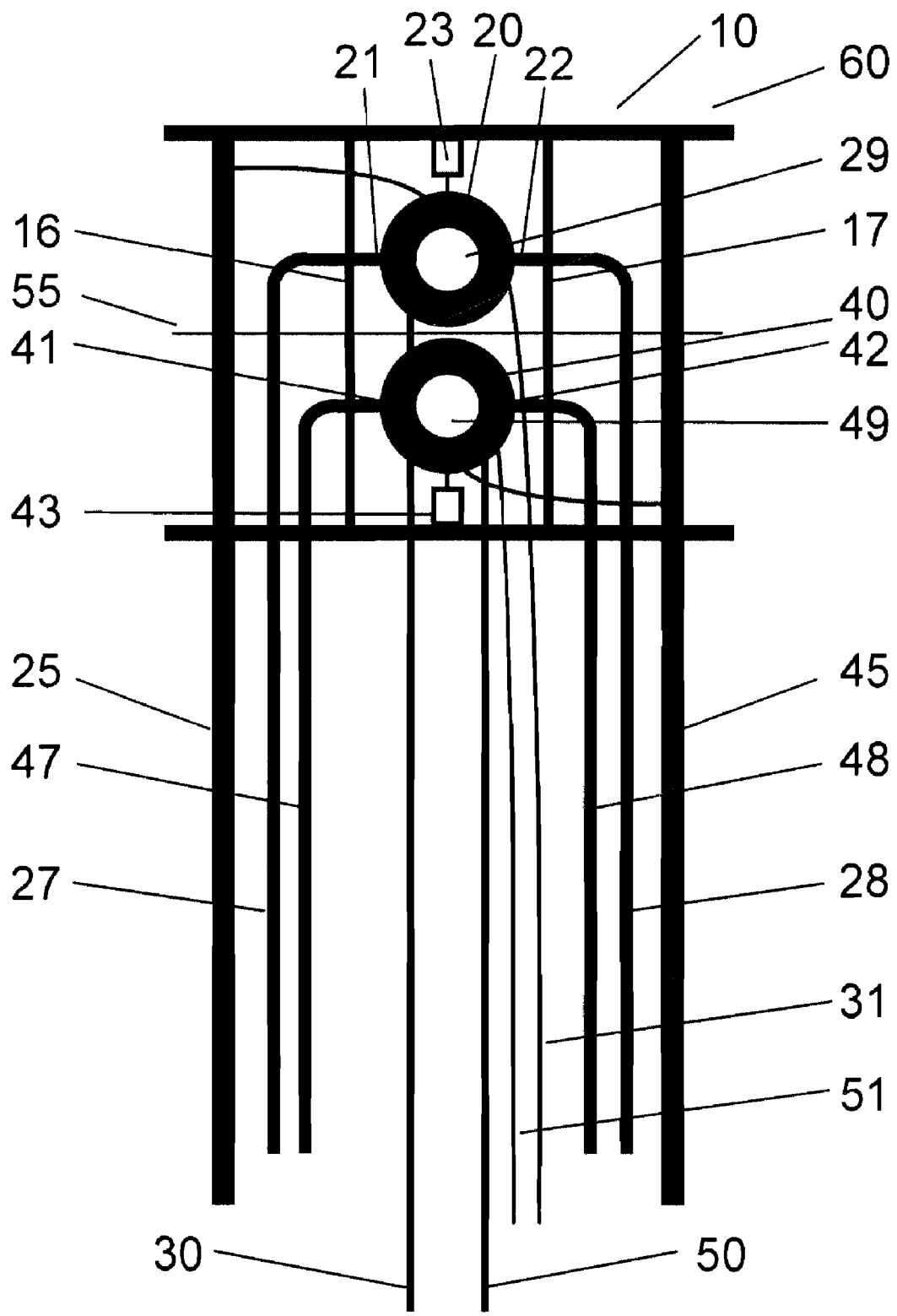
FIG. 1 is a schematic view of an embodiment of a solid-sate NMR probe having two MAS modules in accordance with the present invention. The MAS modules are spaced so that both may be statically positioned within the homogeneous region of the magnetic field.

Referring to FIG. 1, one embodiment of a solid-state NMR probe 10 is shown. The NMR probe 10 includes two magic-angle spinning ("MAS") systems or modules 20, 40. In alternative embodiments, the number of modules can be increased, but is typically two, three, or four MAS modules. The preferred MAS modules may be obtained from Revolution NMR (Fort Collins, Colo.). Any suitable MAS module can be utilized.

The probe 10 can be constructed to use typical MAS modules (for example, 4 or 7 mm o.d. rotors). The probe 10 includes a framework or housing 60 that houses the MAS spinning systems or modules 20, 40. A shield (not shown) can be placed around the housing 60 to protect the components of the probe 10. The MAS modules 20, 40 are attached to mounting plate 16, 17 at attachment points 21, 22 for the first module 20 and attachment points 41, 42 for the second module 40. Between the two MAS modules 20, 40 is a radio frequency ("RF") isolation shield 55.

The first MAS module 20 is coupled to a fixed capacitor 23 (American Technical Ceramics, Huntington Station, N.Y.) for the tuning of the first MAS module 20. The fixed capacitor 23 roughly tunes (+/−3 MHz) the RF circuit for this first MAS module 20. MAS module 20 is coupled to RF transmission line 25. The RF transmission line 25 can be a coaxial cable.

The system for tuning the first module 20 is preferably compact so that additional modules can be positioned no further than 3 cm apart. The MAS modules 20, 40 in the probe 10 are about 2.1 cm apart if both of the MAS modules 20, 40 are designed to use 7 mm o.d. rotors. The MAS modules 20, 40 can be positioned closer together if one or both are designed to use smaller rotors (presently, MAS modules are available commercially with rotors as small as 2 mm o.d.). A second portion of the tuning circuit can be located outside the probe. This tuning circuit can be designed for fixed frequencies with fine-tuning of the circuit performed below the magnet.

Gas is provided to first module 20 through supply lines 27, 28 for the spinning and stabilization of a first sample holder positioned within the first MAS module 20. In solid-state NMR systems incorporating multiple MAS modules, the ability to supply sufficient spinning/bearing air to each module is not trivial. Individual air lines are provided for each MAS module, although space considerations may require alternative air supply methods.

The first sample holder is a compact spinning MAS device (Revolution NMR, Fort Collins, Colo.). Supply lines 27, 28 provide gas (preferably air) in order to rotate the first sample holder positioned within sample cavity 29 defined by the first MAS module 20 and for bearing of the first sample holder within the first module 20, respectively.

A first MAS adjustment device 30 can be coupled to the first MAS module 20 for adjusting the angle of the first MAS module 20 relative to the magnetic field of a superconducting magnet. The first MAS adjustment device 30 can be used to adjust the angle of the first MAS module 20 and the sample contained with the module 20 to maximize the signal obtained during an experiment conducted on the first sample. An angle of 54.7 degrees relative to the magnetic field of the magnet is preferred. While the MAS module 20 is stationary during data acquisition by the spectrometer, it will be appreciated that the position of the MAS module may be adjusted when the spectrometer is not in use.

A first rotation measuring device 31, employing means such as fiber optics, can be coupled to the first MAS module 20 for measuring the rotational speed of the first sample holder contained within the first MAS module 20. A distinctive mark can be placed on the first sample holder to facilitate the measurement of the rotational speed of the first sample holder. Computer control software (such as LabView available from National Instruments, Austin, Tex.) can be used to maintain spinning speed control for the first sample holder contained within the first module 20.

Like the first MAS module 20, the second MAS module 40 is coupled to a fixed capacitor 43 for the tuning of the second MAS module 40. MAS module 40 is coupled to RF transmission line 45. The RF transmission line 45 can be made of coaxial cables.

The system for tuning the second module 40 is also preferably compact so that additional modules can be positioned no further than 3 cm apart. Utilizing variable tuning elements in the probe eliminates the need for a mechanism (such as plastic rods) for changing large variable capacitors that tune the circuit for the second module 40. A second portion of the tuning circuit can be located outside the probe. This tuning circuit can be designed for fixed frequencies with fine-tuning of the circuit performed below the magnet.

Gas is provided to second MAS module 40 through supply lines 47, 48 for the spinning and stabilization of a second sample holder positioned within the second module 40. The second sample holder is also a compact spinning MAS device (Revolution NMR, Ft. Collins Colo.). Supply lines 47, 48 provide gas (preferably air) in order to rotate the second sample holder positioned within a second sample cavity 49 defined by the second module 40 and for bearing of the second sample holder within the second module 40, respectively.

A second MAS adjustment device 50 can be coupled to the second MAS module 40 for adjusting the angle of the second MAS module 40 relative to the magnetic field of a superconducting magnet. The MAS adjustment device 50 can be used to adjust the angle of the second MAS module 40 and the sample contained with the module 50 to maximize the signal obtained during an experiment conducted on the second sample. An angle of 54.7 degrees relative to the magnetic field of the magnet is preferred. While the MAS module 40 is stationary during data acquisition by the spectrometer, it will be appreciated that the position of the MAS module may be adjusted when the spectrometer is not in use.

Further, while the MAS modules 20, 40 are illustrated in FIG. 1 as being vertically aligned directly on top of one another, it will be appreciated that the position of the MAS modules 20, 40 may be altered (for example, such that MAS module 20 is not directly above MAS module 40), provided that both MAS modules are positioned in a stationary position within the homogeneous region of the magnetic field during data acquisition.

A second rotation measuring device 51, employing means such as fiber optics, can be coupled to the second MAS module 40 for measuring the rotational speed of the second sample holder contained within the second MAS module 40. A distinctive mark also can be placed on the second sample holder to facilitate the measurement of the rotational speed of the second sample holder. The same computer control software used for the first sample holder can be used to maintain spinning speed control for the second sample holder contained within the second MAS module 40.

The closer the modules such as modules 20, 40 are to each other, the more samples can be maintained in the homogeneous portion of the magnetic field (which typically spans about 3 to 4 cm). In this regard, compact spinning modules such as those commercially available from Revolution NMR (Fort Collins Colo.) are particularly advantageous. Depending on the system utilized, the minimum distance between MAS modules that does not sacrifice RF performance or magnetic field homogeneity can be determined. Thus, the MAS modules may be less than about 3 cm, 2.9 cm, 2.8 cm, 2.7 cm. 2.6 cm, 2.5 cm, 2.4 cm, 2.3 cm. 2.2 cm, 2.1 cm, 2.0 cm, 1.9 cm, 1.8 cm, 1.7 cm. 1.6 cm, 1.5 cm, 1.4 cm, 1.3 cm. 1.2 cm, 1.1 cm, or 1.0 cm.

It will be appreciated that each MAS module 20, 40 might have different field homogeneity requirements, requiring separate shim parameters. For example, if the field homogeneity requirements of each MAS module 20, 40 are different, then the shim parameters for each MAS module 20, 40 can be optimized separately and stored. In such a case, one step taken when switching signal acquisition from one of the MAS modules 20, 40 to the other would be to apply the shim parameters associated with the MAS module 20, 40 that is next to undergo data acquisition.

The magic angle of the MAS modules 20, 40 can be adjusted at the bottom of the NMR probe 10. This can be done by having individual MAS adjustors extending from the bottom of the probe 10. Preferably, a single MAS adjustor can be used to replace a system that has multiple MAS adjustors extending out of the probe. This MAS adjustor, which can be adjusted to reposition both of the modules 20, 40, requires that the probe 10 be lowered out of a magnet for adjustment of the magic angle. Since the probe 10 is designed to be raised and lowered within the magnet, having the probe extend below the magnet would also enhance sample changing.

Commercially available software, such as Spinsight software used on a commercial spectrometer, such as a Chemagnetics spectrometer, is capable of acquiring the spectra of the MAS modules 20, 40 using either two dimensional software or switching data buffers between acquisitions.

High-power RF switches can be used to direct the output to the individual circuits for the MAS modules 20, 40. Switches are available with power handling capabilities of more than 350 W CW and switching times of less than 20 ms. Alternatively, separate spectrometers can be utilized to control and acquire data from the separate modules 20, 40. Other known techniques for control and acquisition of data from the MAS modules 20, 40 can also be utilized.

Utilizing a probe such as probe 10 results in little or no loss in field homogeneity, sensitivity, MAS speed, or $^1$H decoupling field strength compared to conventional NMR probes. While this approach can be used at any magnetic field strength, it works better at higher field strengths, where $T_1$ relaxation rates are much longer than at lower field strengths. Higher fields also imply faster spinning systems and therefore smaller sample volumes. However, this means that more spinning systems could be placed in the static magnetic field, enabling more samples to be run.

Figure 2:
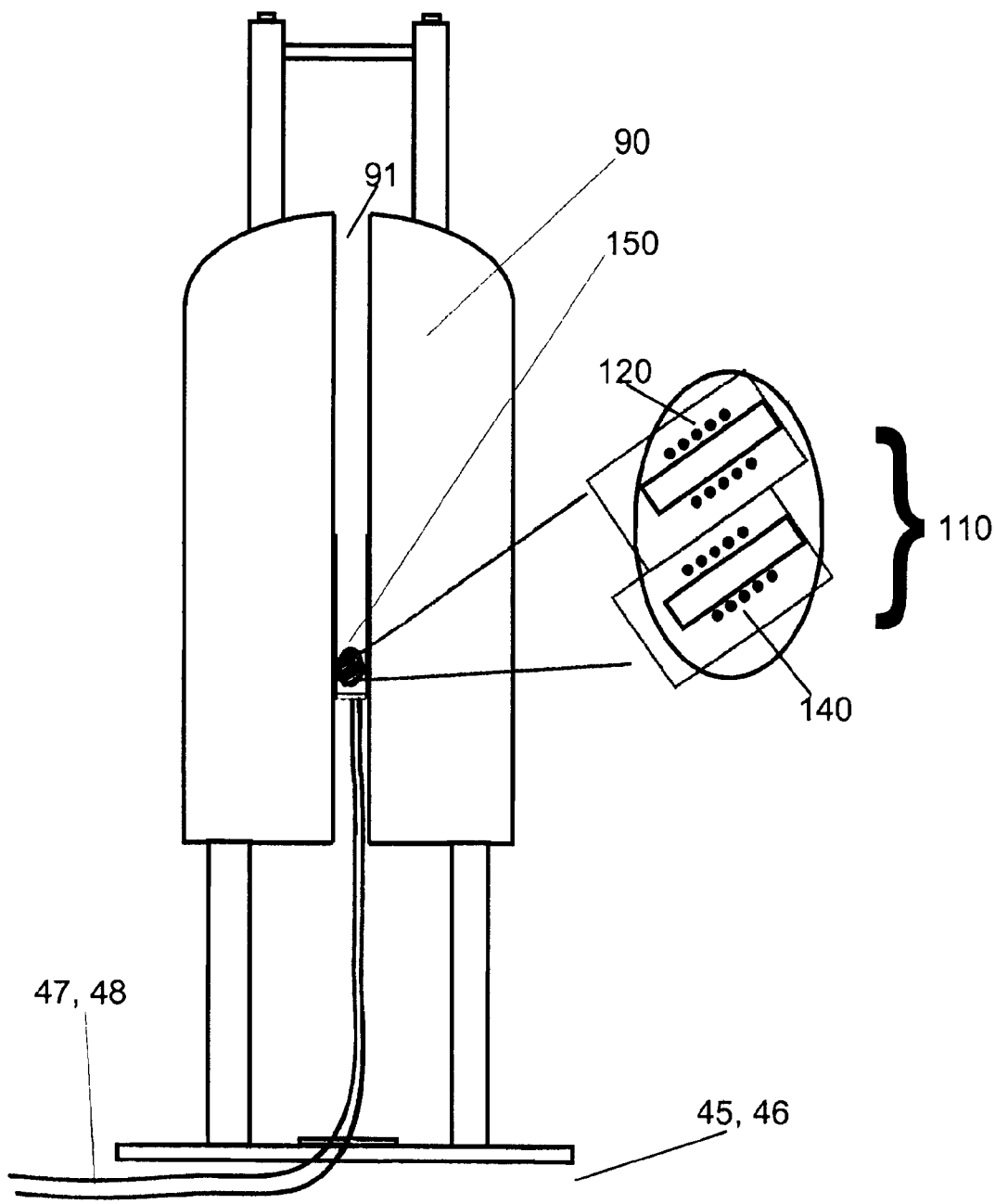
FIG. 2 illustrates a solid-state NMR probe that contains two MAS modules located in the homogeneous region of the magnet.

Referring to FIG. 2, the probe 10 of FIG. 1 is shown positioned within a superconducting magnet 90 as ref no. 110. Probe 110 is inserted into the bore 91 of the magnet 90. Gas lines 47 and 48 are shown coupled to the probe 110. The two MAS module probe 110 shown in FIGS. 1 and 2 is a double-resonance ($^1$H—$^{13}$C) probe, which results in one RF transmission line being coupled to each of the MAS modules 120, 140.

The probe shown in FIG. 2 includes two separate coils distanced less than about 3 cm apart, more specifically about 2.1 cm apart as measured from the center of one coil to the center of the other coil. This distance, along with RF isolation shield 55, reduces cross-talk between coils.

Probe 110 operates for the analysis of different samples contained within a solid-state NMR probe as follows. Both MAS modules 120, 140 are placed inside the homogeneous region of the magnetic field 150. The device 100 may be used in a mode where simultaneous acquisition of signals from both MAS modules 120, 150 is performed. More specifically, each MAS module 120, 140 is associated with a respective signal acquisition device, and each device is independently controlled.

The preferred mode is to acquire the signals from each of the MAS modules 120, 140 located within the homogeneous region of the magnetic field sequentially. That is, because the delay between the end of signal acquisition and the beginning of the next set of acquisition (often referred to as the pulse delay) for most solid or semi-solid samples is at least an order of magnitude greater than the acquisition time, there is sufficient time to switch between samples and acquire the signal sequentially. It may also be practical that if the signal from the first sample is much stronger than from the second sample, then the signal from the second sample should be acquired right after the signal from the first sample. At that time the signal from the first sample will be saturated, and will have a minimal contribution to the signal from the second sample. An alternative would be to saturate the signal from the first sample prior to acquiring the signal from the second sample. This may be feasible if the signal from the first sample had a relatively short relaxation time, and the second sample had a longer relaxation time.

Greater than Two MAS Module Probes and Spectrometers

In another embodiment, a solid-state NMR spectrometer having more than two MAS modules may be constructed. Typically, there will be two, three, or four MAS modules within the homogeneous region of the magnetic field.

RF transmission lines are used to connect the probe to a remote RF tuning device and switching box. The RF tuning device and switching box can be separately housed or housed within a single device. This box serves two purposes. First, each MAS module can be selected independently for signal acquisition. High-power RF switches can be used to direct the output to the individual circuits for the modules. As described above, switches are available with power handling capabilities of greater than 350 W CW and switching times of less than 20 ms. Alternatively, separate spectrometers can be utilized to control and acquire data from the separate modules within probe. Second, the location of box allows each circuit to be tuned independently outside of the magnet, which conserves space.

The box is coupled through connections to other standard components of the spectrometer including high-power amplifiers, a pre-amplifier, and a receiver (acquisition device).

Gas lines are also coupled to the probe. These lines provide the drive and bearing gas for the sample holders within the MAS modules. Additional gas lines can be utilized to provide each spinning module with separate drive and bearing gas.

Preferably, each MAS module includes its own air supply lines, radio-frequency connections, and magic-angle adjustment mechanism, although some or all of these features may be combined. Each spinning module may have variable-temperature capability, independent spinning speed control, and independent shimming parameters.

EXAMPLE 1

Field Homogeneity

Figure 3:
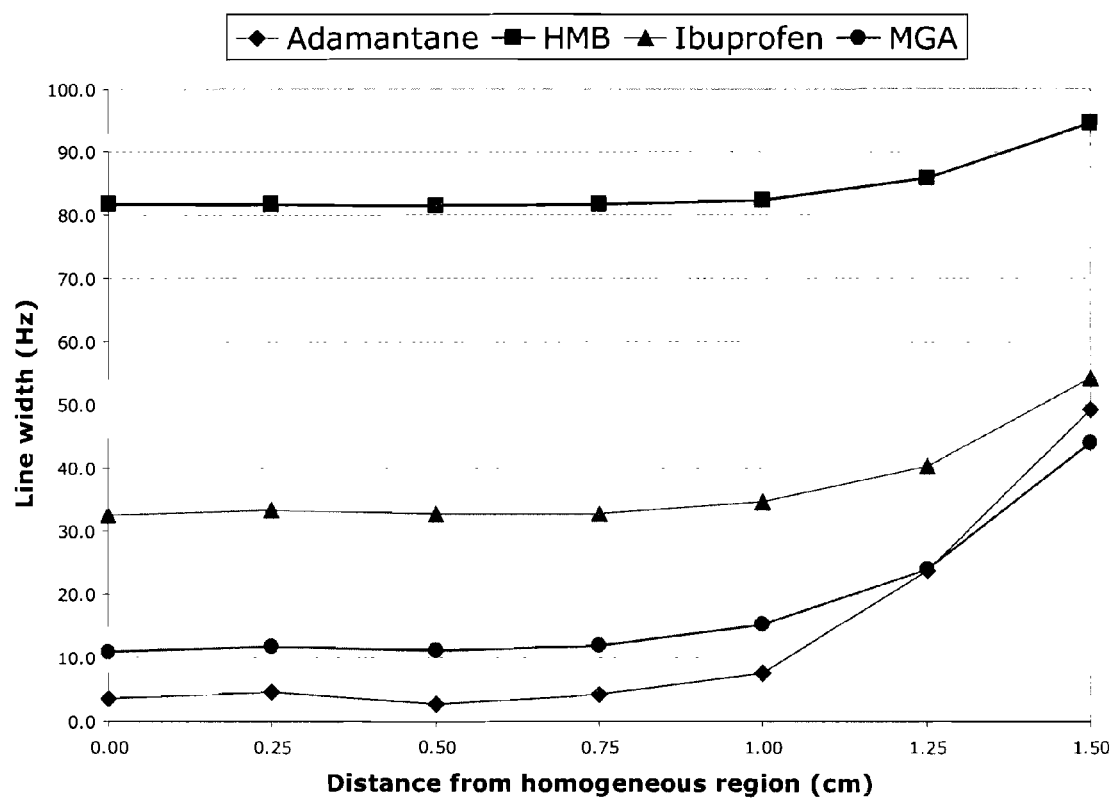
FIG. 3 is a plot of line width vs. distance from the homogeneous region of the magnet. For samples such as adamantane and 3-methylglutaric acid ("MGA"), narrow lines can be obtained in a range of 0 to 1 cm from the original location of the probe. For lines with somewhat broader peaks, there may not be a significant change in line width up to 1.25 cm from the original location of the probe. It should be noted that the graph may not be symmetric, i.e., the negative position values were not measured. Hexamethylbenzene ("HMB") was used as standard.

In this example, the NMR line with was investigated as a function of distance from the homogeneous region of the magnet. The data was acquired on a CMX-II NMR spectrometer using a probe equipped with a 7.0 mm MAS (Revolution NMR). The magnetic field strength was 7.05 Tesla. As shown in FIG. 3, the magnetic field homogeneity for adamantane remained relatively unchanged as the sample was moved over a distance of approximately one centimeter in the magnet. This distance corresponds to a relatively large region over which a high-resolution MAS NMR spectrum could be acquired. This indicates that over this distance it may be possible to place two (or more) MAS systems in which both of them are in the homogeneous region of the magnetic field.

EXAMPLE 2

Stationary Two-MAS Module Probe

An experiment was performed in which a probe was configured with two MAS modules. A distance of about 3 cm separated the two modules measuring from the center of one module to the center of the other. The probe was positioned in the magnet bore so that the sample in each MAS module resided inside the homogeneous region of the magnetic field. NMR spectra (not shown) were acquired from these two modules. The spectra from both modules have line widths (measured as full width at half maximum) that were comparable to spectra collected using a conventional single MAS module probe with the sample residing in the center of the homogeneous region. No cross talk was observed between the two modules.

From the foregoing it will be seen that this invention is one well adapted to attain all ends and objectives herein-above set forth, together with the other advantages which are obvious and which are inherent to the invention. Since many possible embodiments may be made of the invention without departing from the scope thereof, it is to be understood that all matters herein set forth or shown in the accompanying drawings are to be interpreted as illustrative, and not in a limiting sense. While specific embodiments have been shown and discussed, various modifications may of course be made, and the invention is not limited to the specific forms or arrangement of parts and steps described herein, except insofar as such limitations are included in the following claims. Further, it will be understood that certain features and subcombinations are of utility and may be employed without reference to other features and subcombinations. This is contemplated by and is within the scope of the claims.

What is claimed and desired to be secured by Letters Patent is as follows:

1. A solid-state nuclear magnetic resonance probe for use in a magnetic field, the probe comprising:
   a housing adapted to be placed in said magnetic field;
   a plurality of isolated magic angle spinning modules positioned within the housing, the isolated spinning modules being configured to hold different samples for solid-state NMR analysis;
   and wherein the housing is configured so that the plurality of magic angle spinning modules are located in a stationary position within a homogeneous region of said magnetic field during use;
   and wherein said homogeneous region being a region in the magnetic field in which the line width as defined by full width at half height of at least two of said samples is below 0.5 ppm.

2. The probe of claim 1, further comprising a radio-frequency isolation shield, the radio-frequency isolation shield configured to reduce cross-talk between said magic angle spinning modules.

3. The probe of claim 1, wherein the different samples contain the same material for analysis.

4. The probe of claim 1, wherein said plurality of magic angle spinning modules are positioned less than 3 cm apart.

5. The probe of claim 1, wherein said plurality of magic angle spinning modules are vertically positioned on top of one another.

6. The probe of claim 1, wherein said stationary position of said magic angle spinning modules may be adjusted when said probe is not in use.

7. A system for use in solid-state nuclear magnetic resonance spectroscopy, the system comprising:
   a probe of claim 1; and
   an acquisition device coupled to said magic angle spinning modules, the acquisition device being configured to acquire a spectrum from said magic angle spinning modules placed - within the homogeneous region of a magnet.

8. A solid-state nuclear magnetic resonance spectrometer comprising:
   a magnet, the magnet defining a bore;
   a probe according to claim 1; and
   an acquisition device coupled to said magic angle spinning modules, the acquisition device being configured to acquire a signal from said isolated spinning modules.

9. The solid-state nuclear magnetic resonance spectrometer of claim 8, wherein the magnet is a superconducting magnet.

10. The solid-state nuclear magnetic resonance spectrometer of claim 8, further comprising a radio-frequency isolation shield, the radio-frequency isolation shield configured to reduce cross-talk between said magic angle spinning modules.

11. The solid-state nuclear magnetic resonance spectrometer of claim 8, wherein the different samples contain the same material for analysis.

12. The solid-state nuclear magnetic resonance spectrometer of claim 8, wherein said plurality of magic angle spinning modules are positioned less than 3 cm apart.

13. The solid-state nuclear magnetic resonance spectrometer of claim 8, wherein said plurality of magic angle spinning modules are vertically positioned on top of one another.

14. A method for the analysis of a solid-state sample, the method comprising the steps of:
   providing a magnet for generating a magnetic field, the magnet defining a bore;
   providing a probe, said probe having a first isolated magic angle spinning module and a second isolated magic angle spinning module;
   positioning said probe within the bore of the magnet so that said first and second magic angle spinning modules are within a homogeneous region of said magnetic field;
   acquiring a first spectrum from a first sample contained within the first magic angle spinning module; and
   acquiring a second spectrum from a second sample contained within the second magic angle spinning module.

15. The method of claim 14 wherein said step of acquiring said first spectrum and said step of acquiring said second spectrum is performed simultaneously.

16. The method of claim 14 wherein said step of acquiring said first spectrum and said step of acquiring said second spectrum is performed sequentially.

17. The method of claim 14 wherein said probe further comprises a radio-frequency isolation shield, the radio-frequency isolation shield configured to reduce cross-talk between said magic angle spinning modules.

18. The method of claim 14 wherein said first sample and said second sample contain the same material for analysis.

19. The method of claim 14 wherein said first and second magic angle spinning modules are positioned less than 3 cm apart.

20. The method of claim 14 wherein said first and second magic angle spinning modules are vertically positioned on top of one another.

* * * * *

UNITED STATES PATENT AND TRADEMARK OFFICE
CERTIFICATE OF CORRECTION

PATENT NO. : 7,626,391 B2 Page 1 of 1
APPLICATION NO. : 12/013237
DATED : December 1, 2009
INVENTOR(S) : Eric J. Munson, Dewey H. Barich and Benjamin N. Nelson It is certified that error appears in the above-identified patent and that said Letters Patent is hereby corrected as shown below:

Column 1,
Line 16, delete "Not applicable." and insert --The U.S. Government has a paid-up license in this invention and the right in limited circumstances to require the patent owner to license others on reasonable terms as provided for by the terms of Grant No. CHE-0416214 awarded by the National Science Foundation.--

Signed and Sealed this

Twenty-third Day of February, 2010

David J. Kappos
*Director of the United States Patent and Trademark Office*